(12) United States Patent
Arik et al.

(10) Patent No.: US 8,496,049 B2
(45) Date of Patent: Jul. 30, 2013

(54) HEAT SINKS WITH DISTRIBUTED AND INTEGRATED JET COOLING

(75) Inventors: Mehmet Arik, Niskayuna, NY (US); Tunc Icoz, Schenectady, NY (US); Juan Manuel Rivas Davila, Niskayuna, NY (US); Charles Erklin Seeley, Niskayuna, NY (US); Yogen Vishwas Utturkar, Niskayuna, NY (US); Stanton Earl Weaver, Jr., Northville, NY (US)

(73) Assignee: General Electric Company, Niskayuna, NY (US)

( * ) Notice: Subject to any disclaimer, the term of this patent is extended or adjusted under 35 U.S.C. 154(b) by 1147 days.

(21) Appl. No.: 12/421,068

(22) Filed: Apr. 9, 2009

(65) Prior Publication Data
US 2010/0258270 A1   Oct. 14, 2010

(51) Int. Cl.
*H05K 7/20*   (2006.01)

(52) U.S. Cl.
USPC .......................................... 165/80.3; 361/697

(58) Field of Classification Search
USPC ...... 165/80.3, 80.4, 80.5, DIG. 224; 361/694, 361/697, 699; 417/413.1, 413.2
See application file for complete search history.

(56) References Cited

U.S. PATENT DOCUMENTS

| | | | |
|---|---|---|---|
| 5,299,090 A * | 3/1994 | Brady et al. | 361/703 |
| 6,123,145 A | 9/2000 | Glezer et al. | |
| 6,588,497 B1 | 7/2003 | Glezer et al. | |
| 6,722,581 B2 | 4/2004 | Saddoughi | |
| 6,937,472 B2 | 8/2005 | Pokhama | |
| 7,023,697 B2 | 4/2006 | Pokharna et al. | |
| 7,055,329 B2 | 6/2006 | Martens et al. | |
| 7,307,841 B2 | 12/2007 | Berlin et al. | |
| 7,336,486 B2 | 2/2008 | Mongia | |
| 7,990,705 B2 | 8/2011 | Bult et al. | |
| 2004/0190305 A1 | 9/2004 | Arik et al. | |
| 2005/0121171 A1 | 6/2005 | Mukasa et al. | |
| 2006/0196638 A1 * | 9/2006 | Glezer et al. | 165/80.3 |
| 2006/0267184 A1 | 11/2006 | Kinsman et al. | |
| 2008/0137289 A1 | 6/2008 | Arik et al. | |

(Continued)

FOREIGN PATENT DOCUMENTS

| EP | 1762725 A1 | 3/2007 |
|---|---|---|
| JP | 2008008230 | 1/2008 |

OTHER PUBLICATIONS

Li et al., "Enhancement of Natural Convection Using Synthetic Jets", IEEE, 8 pages 2010.

(Continued)

*Primary Examiner* — Teresa Walberg
(74) *Attorney, Agent, or Firm* — Penny A. Clarke (57) ABSTRACT

A heat sink with distributed jet cooling is provided. The heat sink includes a base for thermal connection to at least one heated object, an array of fins thermally coupled to the base, and at least one multi-orifice synthetic jet or multiple single orifice jets disposed on a side of the array of fins. A heat sink with distributed and integrated jet cooling is also provided and includes a base and an array of fins. Respective ones of at least a subset of the fins comprise a synthetic jet configured to eject an ambient fluid into an ambient environment of the fins and base. Another heat sink with distributed and integrated jet cooling is provided and includes a base, an array of fins and multiple synthetic jets coupled to respective ones of the fins. The synthetic jets are provided for at least a subset of the fins.

10 Claims, 8 Drawing Sheets

U.S. PATENT DOCUMENTS

2008/0277103 A1 11/2008 Yamada et al.
2009/0174999 A1 7/2009 Sauciuc et al.
2010/0018675 A1 1/2010 Aarts et al.
2011/0024092 A1* 2/2011 Gerlach .................. 165/104.34

OTHER PUBLICATIONS

Search Report and Written Opinion from corresponding EP Application No. 10158793.9-1235 dated Aug. 24, 2012.

* cited by examiner

HEAT SINKS WITH DISTRIBUTED AND INTEGRATED JET COOLING

BACKGROUND

The invention relates generally to thermal management systems, and more particularly to thermal management systems for use in embedded environments.

Environments having embedded electronic systems, hereinafter embedded environments or heated environments, offer challenges for thermal management. Such systems produce waste heat as a part of their normal operation, heat that must be removed for proper performance and reliability of the embedded electronics. The design of thermal management systems to provide cooling for embedded electronics is a formidable challenge due to space limitations. Examples of embedded electronic systems include single board computers, programmable logic controllers (PLCs), operator interface computers, laptop computers, cell phones, personal digital assistants (PDAs), personal pocket computers, and other small electronic devices, there is a limited amount of available space for thermal management systems. It has been known to use passive cooled heat sinks or forced air-cooling as thermal management systems to assist in the removal of heat from electronic components. Further, it has been known that conducting the heat generated by electronic components to a printed circuit board, on which they are mounted, provides a migration of the heat from a smaller area to a larger area. However, such techniques have limited heat removal capabilities.

Accordingly, there is a need for improved thermal management systems for embedded electronic systems.

BRIEF DESCRIPTION

One aspect of the invention resides in a heat sink with distributed jet cooling. The heat sink includes a base for thermal connection to at least one heated object. The heat sink further includes an array of fins thermally coupled to the base. At least one multi-orifice synthetic jet or multiple single orifice jets is (are) disposed on a side of the array of fins.

Another aspect of the invention resides in a heat sink with distributed and integrated jet cooling. The heat sink includes a base for thermal connection to at least one heated object. The heat sink further includes an array of fins thermally coupled to the base. Respective ones of at least a subset of the fins comprise a synthetic jet configured to eject an ambient fluid into an ambient environment of the fins and base.

Yet another aspect of the invention resides in a heat sink with distributed and integrated jet cooling. The heat sink includes a base for thermal connection to at least one heated object, and an array of fins thermally coupled to the base. The heat sink further includes multiple synthetic jets coupled to respective ones of the fins and configured to eject an ambient fluid into an ambient environment of the fins and base. The synthetic jets are provided for at least a subset of the fins.

These and other advantages and features will be more readily understood from the following detailed description of preferred embodiments of the invention that is provided in connection with the accompanying drawings.

DETAILED DESCRIPTION

Figures 1, 2:
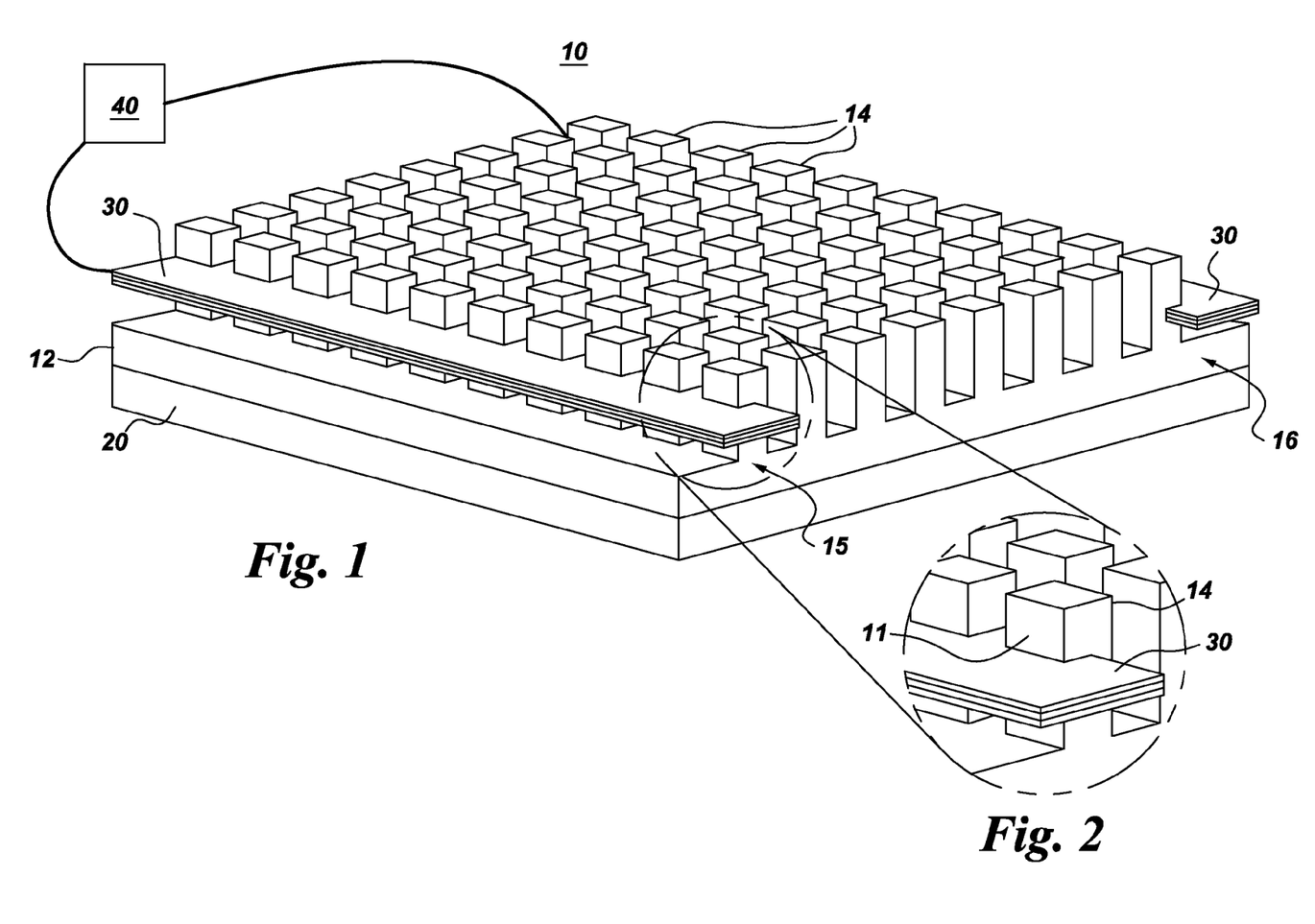
FIG. 1 illustrates a heat sink with distributed jet cooling.
FIG. 2 is an enlarged view of a portion of the heat sink of FIG. 1 at a synthetic jet.

FIGS. 1 and 2 illustrate a heat sink 10 with distributed jet cooling. As shown, for example, in FIG. 1, the heat sink comprises a base 12 for thermal connection to at least one heated object 20. The heated object 20 may be any object requiring cooling, non-limiting examples of which include high power processors and power electronics. The base 12 (base plate or sink plate) can be formed of a variety of thermally conductive materials, as known in the art. The heat sink 10 further includes an array of fins 14 thermally coupled to the base. The fins may be arranged in a two-dimensional array of "pin fins" as shown, for example in FIG. 1. For other arrangements, the fins 14 may take the form of a one-dimensional array of "plate fins" defining slots between them, as shown for example in FIGS. 7 and 8. Briefly, the heat from the heated object 20 is transferred into the base 12, which in turn transfers heat into the fins 14. The fins 14 increase the surface area for heat transfer for cooling the heated body 20.

Figure 3:
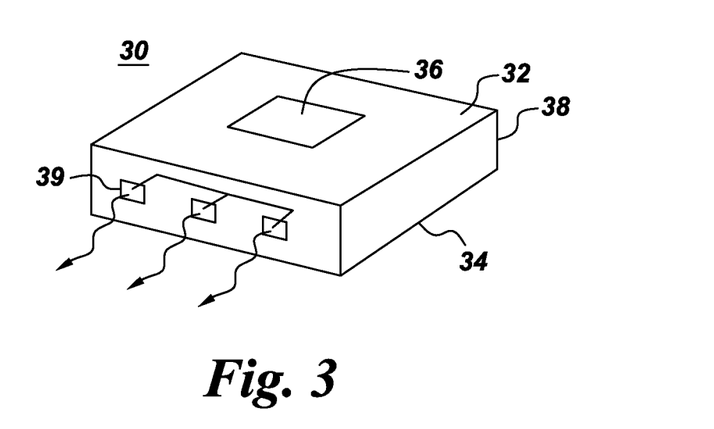
FIG. 3 depicts an example configuration for a multi-orifice synthetic jet for use in the heat sink of FIGS. 1 and 2.

In the illustrated example, the heat sink 10 further includes at least one multi-orifice synthetic jet 30 disposed on a side 15, 16 of the array of fins. In other example arrangements, multiple single jets are disposed on the respective side 15, 16 of the array of fins. The multiple single jets are similar to the multi-orifice synthetic jets discussed herein, except that that the single jets include a single orifice. For the example illustrated in FIG. 3, each of the multi-orifice synthetic jets 30 comprises a first flexible structure 32, a second flexible structure 34, at least one active material 36 coupled to at least one of the first and second flexible structures, and a compliant wall 38 positioned between the first and second flexible structures and defining a chamber. As indicated in FIG. 3, the compliant wall defines multiple orifices 39 for facilitating fluid communication between the chamber and an ambient environment of the fins 14. It should be noted that the number of orifices shown in FIG. 3 is merely illustrative and is non-limiting. In one non-limiting example, the compliant wall 38 comprises an elastomer. Other example materials for the compliant wall 38 include, without limitation, polymers, glues, adhesives, metals, and composites.

In the illustrated arrangement of FIG. 3, the active material 36 is positioned on both of the first and second flexible structures 32, 34. It should be noted that the locations of the active materials 36 on the flexible structures 32, 34 shown in the figures are purely illustrative, and the invention is not limited to any specific locations of active materials. In particular embodiments, the active material is coextensive with the respective flexible structure. In other embodiments, the active material extends over only a portion of the flexible structure. The active material can take the form of a single continuous portion. Alternatively, multiple discontinuous portions of the active material can be employed to actuate respective ones of the flexible structures. A suitable active material is one, which is capable of creating stress resulting from an electrical stimulus.

Examples of suitable active material include piezoelectric material, magnetostrictive material (magnetic fields from coils attract/oppose one another), shape-memory alloy, and motor imbalance (motor with a mass imbalance creates oscillatory motion). Within the subset of piezoelectric materials, suitable active materials include bimorph piezoelectric configurations, where two piezo layers are energized out of phase to produce bending; thunder configurations, where one piezo layer is disposed on a pre-stressed stainless steel shim; buzzer element configurations, where one piezo layer is disposed on a brass shim; and MFC configurations, where a piezo fiber composite on a flexible circuit is bonded to a shim. The active material may incorporate a ceramic material.

Figure 4:
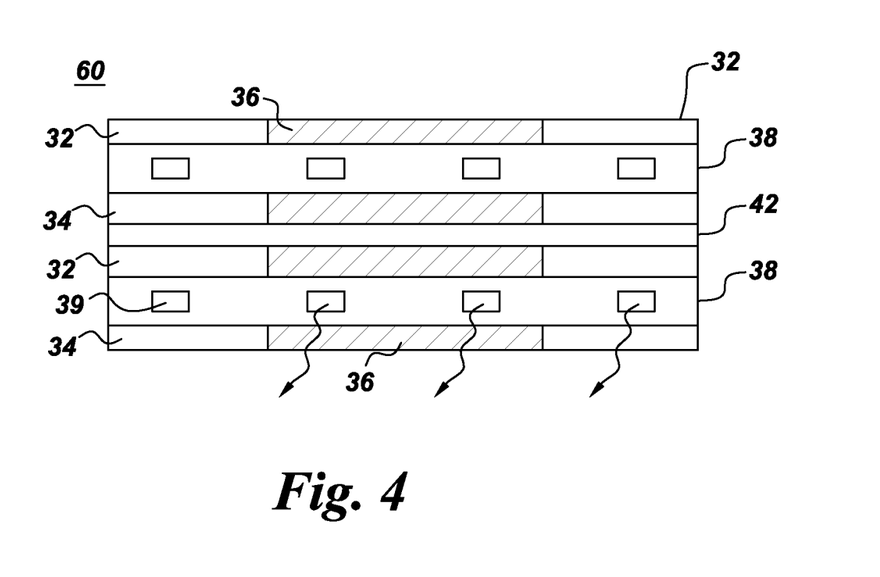
FIG. 4 depicts an example multi-stack synthetic jet assembly for use in the heat sink of FIGS. 1 and 2.

As indicated in FIG. 4, the heat sink 10 may comprise a stack 60 of the single or multi-orifice synthetic jets 30. Similar to the arrangement described with reference to FIGS. 1 and 2, the stack 60 is disposed on one of the sides 15, 16 of the array of fins 14. Although FIG. 4 depicts a stack of two multi-orifice synthetic jets, the stack 60 may include any number of synthetic jets depending on the cooling application (for example, on the fin 14 height). The synthetic jets 30 may be separated by a spacer 42, as indicated in FIG. 4. In one non-limiting example, the spacer 42 comprises plastic.

Figure 5:
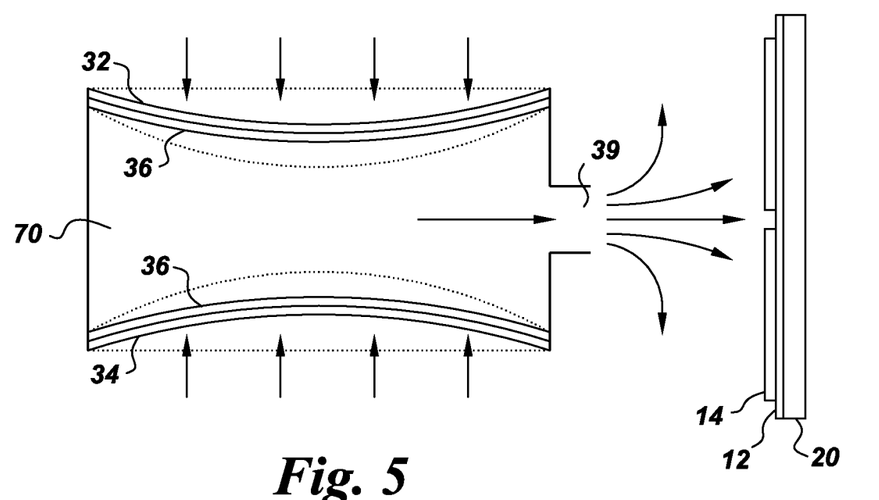
FIG. 5 illustrates the expulsion of ambient air from a chamber in response to contraction of the flexible chamber walls.
Figure 6:
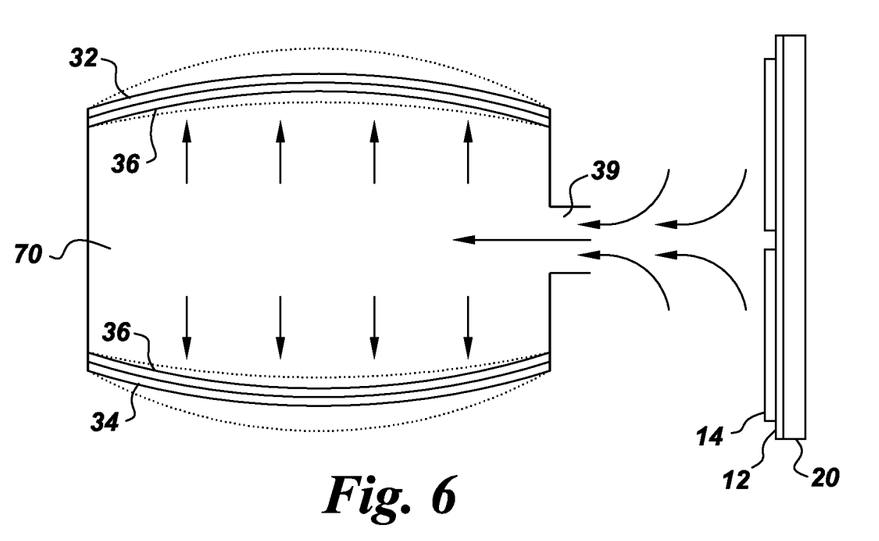
FIG. 6 illustrates the ingestion of air into the chamber in response to expansion of the flexible chamber walls.

As schematically depicted in FIG. 1, a synthetic jet driver 40 is provided to apply an electrical current to the at least one active material 36, to form streams of ambient air. The synthetic jet driver 40 can be electrically coupled to the active material 136 using wires or flexible interconnects, for example. Briefly, electrical current from synthetic jet driver 40 is received by the active material, and transformed into mechanical energy. As shown, for example in FIG. 5, the active material 36 creates stress on the flexible walls 32, 34, causing them to flex inwardly, resulting in a chamber volume change and an influx of ambient air into the chamber 70, and then outwardly, thereby ejecting the ambient air from the chambers 70 via the orifices 39. Similarly, as illustrated in FIG. 6, when the active material 36 creates stress on the flexible chamber walls 32, 34 causing them to expand, resulting in another chamber volume change, ambient air is drawn into the chamber 70 via the orifices 39. In this manner, the driver 40 actuates the jets 30.

The synthetic jet driver 40 may be co-located with the other heat sink elements or may be remotely located. The current may be provided as a sine wave, a square wave, a triangular wave, or any other suitable waveform, and it should be appreciated that the current is not to be limited to any specific waveform. However, it has been found that currents having lower harmonics, such as, for example, a sine wave, may be used to provide a quieter synthetic jet 30. The voltage level for the electrical current may be between 1 and 150 volts but is not so limited. The frequency of the current may be between 2 and 300 hertz for embodiments requiring reduced noise, and between 300 hertz and 15 kilohertz for embodiments that do not require reduced noise levels.

For the example arrangement depicted in FIGS. 1 and 2, the heat sink 10 comprises multiple multi-orifice synthetic jets 30 disposed on respective sides 15, 16 of the array of fins 14. In particular, for the arrangement of FIG. 1, there are two multi-orifice synthetic jets 30 disposed on the respective sides 15, 16 of the array of fins 14. As indicated by the arrows in FIG. 2, for this example arrangement, the orifices may be disposed, so as to direct air between the fins 14 and to draw air from between the fins 14.

The orifices 39 may be configured in a variety of arrangements depending on the desired cooling flow and on the configuration of the array of fins 14. In one example arrangement, at least a subset of the orifices 39 are positioned to eject an ambient fluid directly on the fins 14. In another example arrangement, at least a subset of the orifices 39 are oriented at an angle transverse to an opposing surface 11 of the fins 14. For certain configurations, the ambient fluid is ejected perpendicular to a plane of the fins 14, as indicated for example in FIG. 5.

Figure 7:
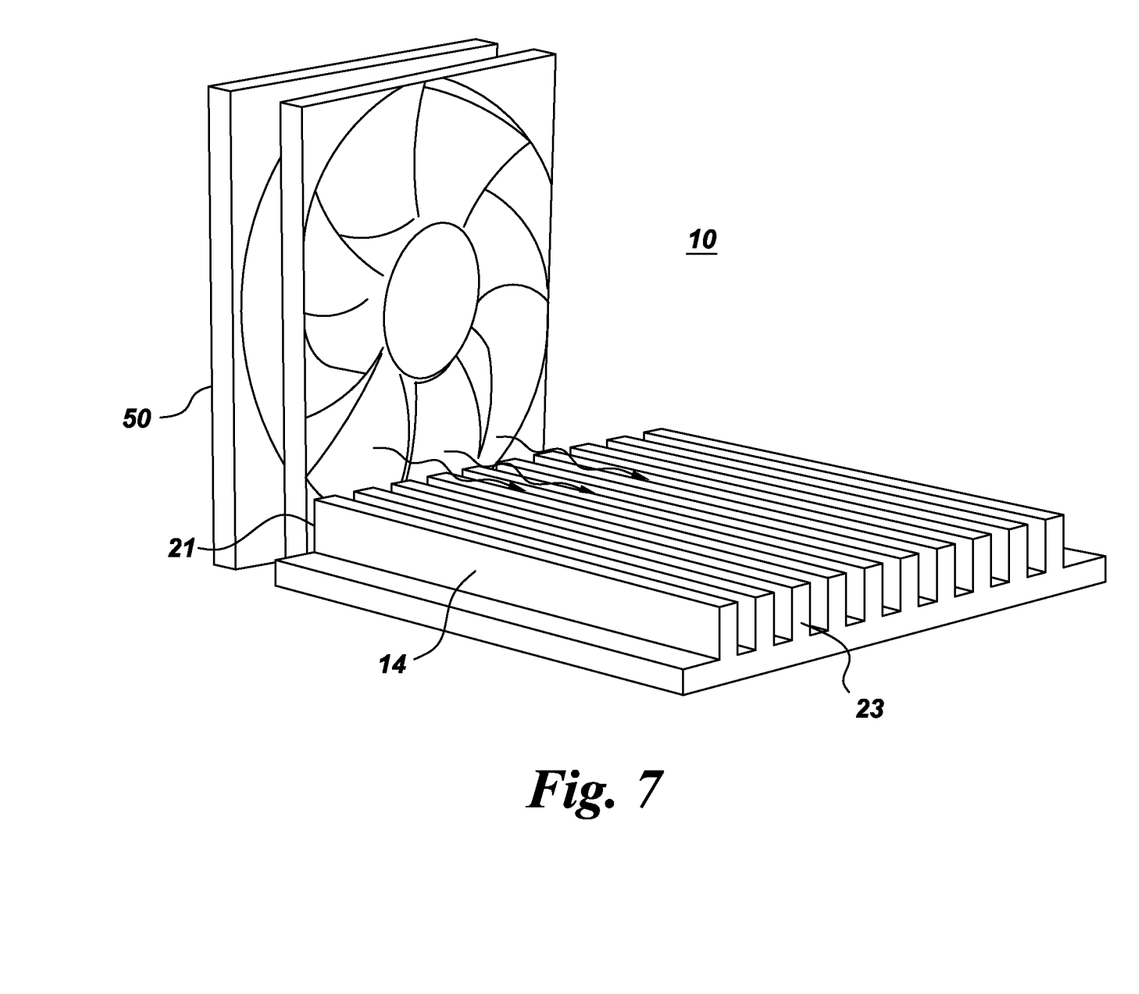
FIG. 7 illustrates a first fan location for a heat sink embodiment of the invention.
Figure 8:
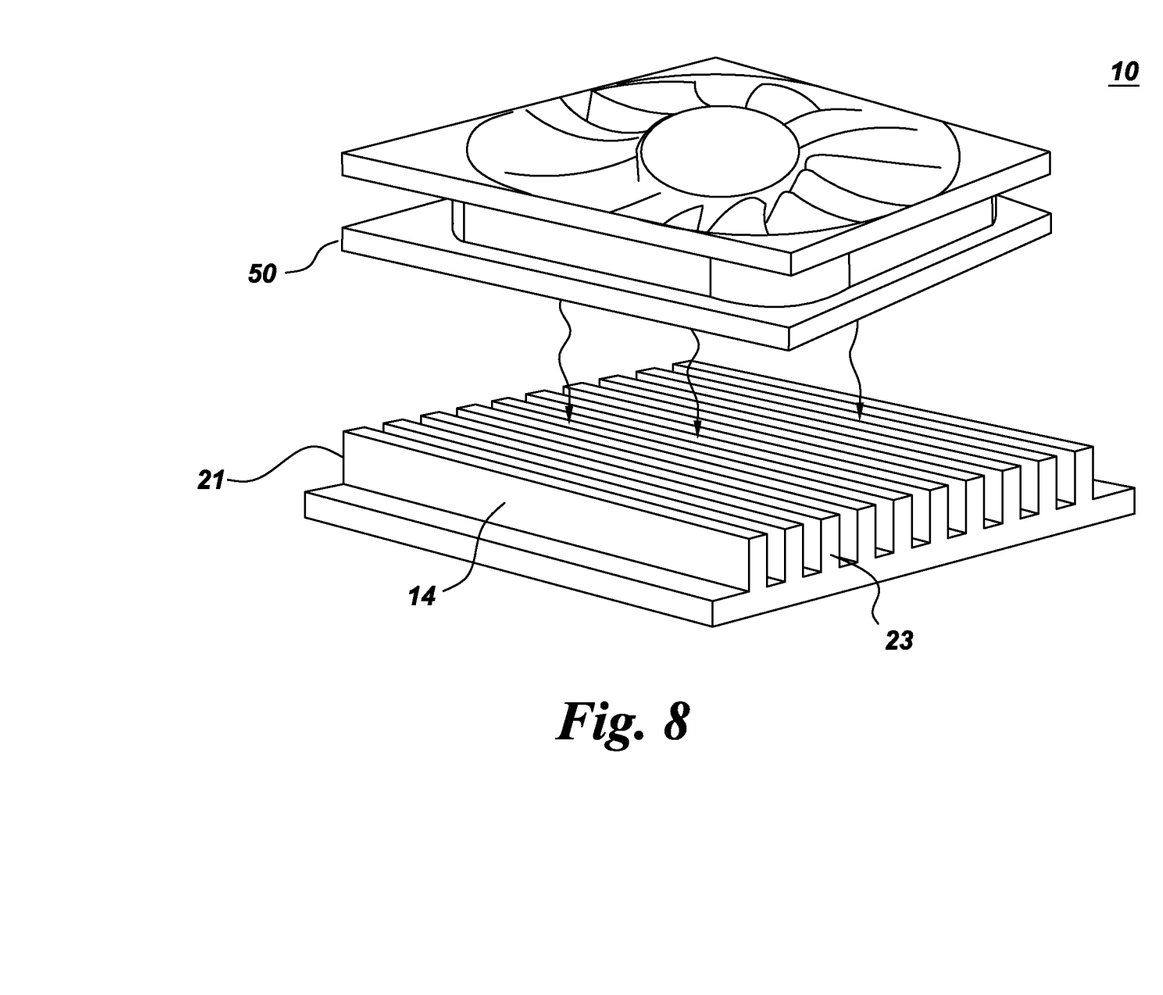
FIG. 8 illustrates a second fan location for a heat sink embodiment of the invention.

As shown, for example, in FIG. 7, for particular embodiments, the heat sink 10 further comprises a fan 50 disposed on one of an inlet and an outlet side 21, 23 of the array of fins 14. The fan 50 is configured to draw the ambient fluid through the fins 14, and the ambient fluid drawn by the fan 50 interacts with the ambient fluid ejected from the multi-orifice synthetic jets or from the multiple single jets to further enhance the cooling by at least ten percent (10%) relative to a jet-free condition. For configurations having the fan 50 disposed at the inlet side 21 of the fins 14, the fan 50 is configured to push flow towards the array of fins. Similarly, fans 50 disposed at the outlet side 23 of the array of fins are configured to pull flow through the array. FIG. 8 illustrates another arrangement, in which the fan 50 is disposed above the array of fins 14 and configured to blow an ambient fluid on the fins 14.

Figure 15:
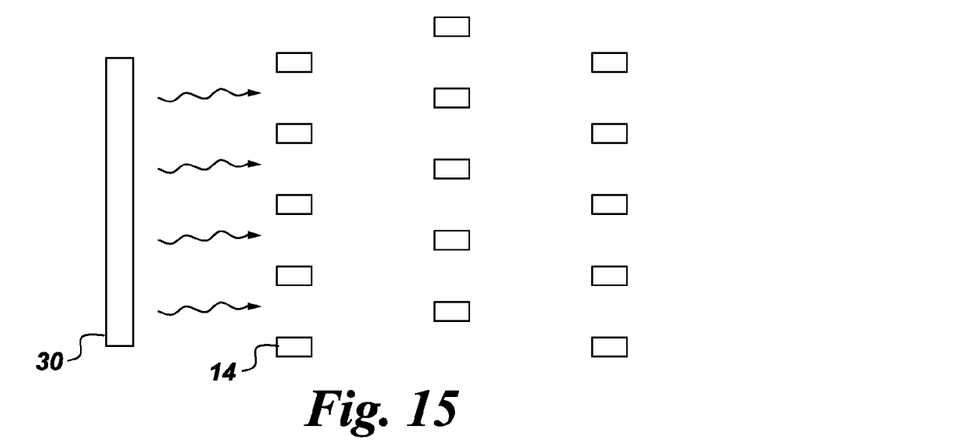
FIG. 15 illustrates a v-groove configuration for the heat sink of FIGS. 1-6.
Figure 16:
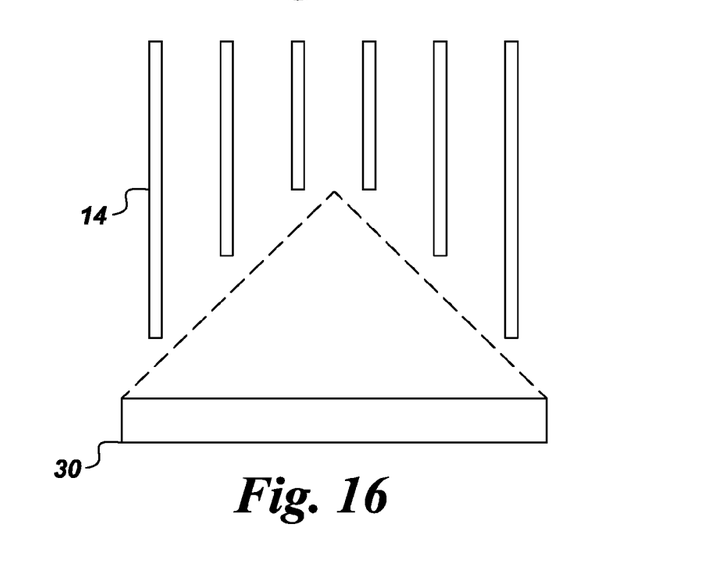
FIG. 16 illustrates a v-groove plate fin configuration.

A number of different fin configurations can be employed for the heat sink of FIGS. 1-6. For the arrangement depicted in FIG. 1, the fins 14 are pin fins and are arranged in a regular array. FIG. 15 illustrates another pin fin configuration for the heat sink 10 of FIGS. 1-6, in which the fins 14 are staggered (offset) to provide a v-groove cooling configuration. FIG. 16 illustrates a v-groove plate fin configuration. Under specific circumstances, computer simulation results have demonstrated a thirty percent performance enhancement for the v-groove configuration relative to the conventional plate fin arrangement shown for example in FIGS. 7 and 8. This enhanced cooling is due in large part to more efficient confinement of the vortices in the v-groove heat sink fin arrays. Unlike the air flow from a fan, the flow field surrounding the vortex dipoles consists of velocity vectors which are not largely parallel to the heat sink fin gaps. As a result, as these vortices approach a conventional heat sink (without grooving), their local approach velocities may not be well-aligned with the fin gaps, causing an imperfect transfer of momentum to the air in the gaps. The v-grooving improves the entrapment of this momentum contained within the dipoles and enhances the heat transfer off the heat sink. It should be noted that although FIGS. 15 and 16 show v-groove configurations with symmetric v-grooves, the invention is not limited to these arrangements and can also employ asymmetric v-groove configurations. Similarly, although FIGS. 15 and 16 show v-grooves with centerlines aligned with the respective centerlines of the jets, offset arrangements may also be employed, in which the centerlines of the v-grooves are offset from the centerlines of the jets. Similarly, combinations of these arrangements may also be employed (asymmetric v-grooves that are offset for the respective jets).

Figures 9, 10, 11:
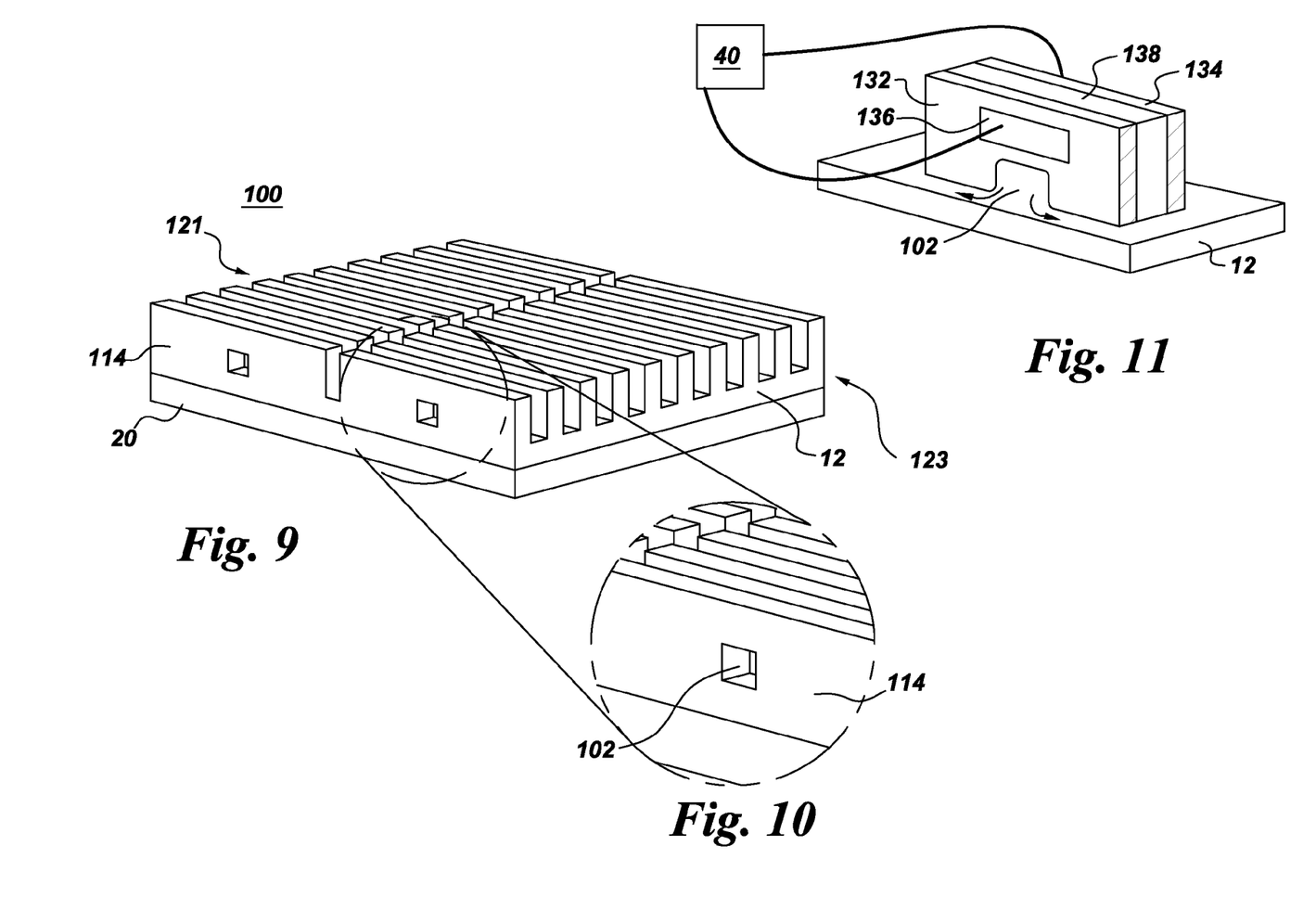
FIG. 9 illustrates another heat sink embodiment of the invention with distributed and integrated jet cooling.
FIG. 10 is an enlarged view of a portion of the heat sink of FIG. 9 at a synthetic jet.
FIG. 11 schematically depicts a single plate fin with an integrated synthetic jet for use in the heat sink of FIGS. 9 and 10.

FIGS. 9-11 illustrate another heat sink 100 embodiment of the invention with distributed and integrated jet cooling. As shown for example in FIG. 9, the heat sink 100 includes a base 12 for thermal connection to at least one heated object 20. As discussed above, the invention is not limited to cooling a specific type of heated object, but rather can be used to cool a variety of heated objects. The heat sink 100 further includes an array of fins 114 thermally coupled to the base 12. For the example configuration shown in FIG. 9, a two-dimensional array of "plate fins" is employed. Respective ones of at least a subset of the fins comprise a synthetic jet 102 configured to eject an ambient fluid into an ambient environment of the fins and base. In specific embodiments, a synthetic jet 102 is inset into each of the fins 114. The synthetic jets 102 are shown in greater detail in FIG. 10.

FIG. 11 schematically depicts a single plate fin 114 with an integrated synthetic jet for use in the heat sink of FIGS. 9 and 10. As shown in FIG. 11, each of the fins 114 with an integrated jet 102 comprises a first flexible structure 132, a second structure 134, and at least one active material 136 coupled to the first flexible structure 132. The active material 136 is discussed above with reference to heat sink 10. For the integrated embodiment of FIGS. 9-11, example materials for the flexible structures 132, 134 include, without limitation, metal-based materials, such as aluminum and copper, composite structures, for example, carbon fiber filled materials, and thermally conductive polymer based materials. A compliant wall 138 is positioned between the first and second structures 132, 134 thereby forming a chamber. The compliant wall 138 defines at least one orifice 139 for facilitating fluid communication between the chamber and the ambient environment.

According to a more particular embodiment, the second structure 134 is flexible, and the active material 136 is coupled to at least one of the first and second flexible structures 132, 134. In more particular embodiments, active material 136 is coupled to both flexible structures 132, 134, such that both of these walls are actuated. As discussed above, the active material can take the form of a single continuous portion. Alternatively, multiple discontinuous portions of the active material can be employed to actuate respective ones of the flexible structures.

Figure 17:
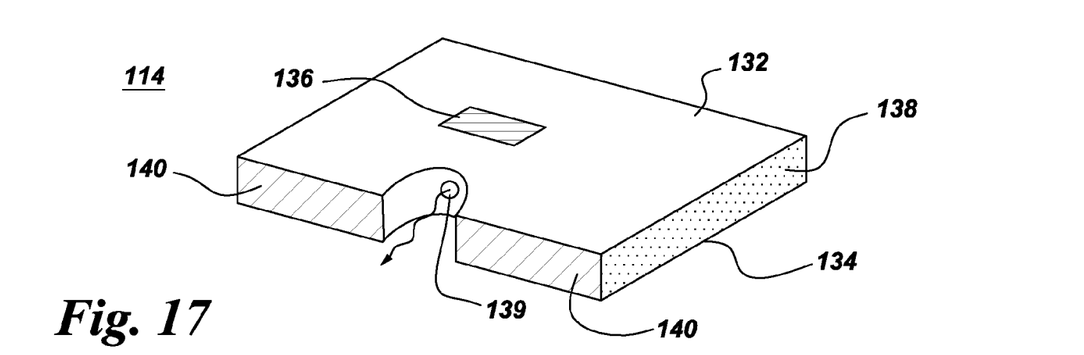
FIG. 17 illustrates a particular configuration of the fin of FIGS. 9-11 with enhanced thermal coupling to the base of the heat sink.

FIG. 17 illustrates a particular configuration of the fin 114 of FIGS. 9-11 with enhanced thermal coupling to the base of the heat sink. For the example configuration shown in FIG. 17, each of the fins 114 with an integral jet further comprises at least one thermally conductive portion 140 extending between the first and second structures 132, 134 and disposed to thermally couple the fin to the base 12. In the illustrated example shown in FIG. 17, the fin 114 includes two thermally conductive portions 140. Non-limiting example materials for the thermally conductive portions 140 include metals, such as copper. In example arrangements the thermally conductive portions 140 are attached to the base plate, for example by brazing.

For the example shown in FIG. 11, at least one synthetic jet driver 40 is provided to actuate one or more of the synthetic jets 102. The synthetic jet driver 40 can be electrically coupled to the active material 136 using wires or flexible interconnects, for example. As noted above, the synthetic jet driver 40 may be co-located with the other heat sink elements or may be remotely located. The operation of the synthetic jets 102 is similar to that of multi-orifice synthetic jets 30 described above with reference to FIGS. 5 and 6.

Advantages of the heat sink 100 embodiment described with reference to FIGS. 9-11 and 17 include a compact, relatively light design with increased surface area. In addition, the design is rugged, in that the active material is inherently protected by the fins.

Further, the synthetic jets 102 can be used alone or in combination with one or more fans 50, depending on the application. As discussed above with reference to FIG. 7, a fan 50 may be disposed on one of an inlet and an outlet side 121, 123 of the array of fins 114. The fan is configured to draw the ambient fluid through the fins 114, such that the ambient fluid drawn by the fan 50 interacts with the ambient air ejected from the synthetic jets 102 to further enhance the cooling. Similarly, as discussed above with reference to FIG. 8, a fan 50 may be disposed above the array of fins 114 and configured to blow the ambient fluid on the fins 114.

Figures 12, 13, 14:
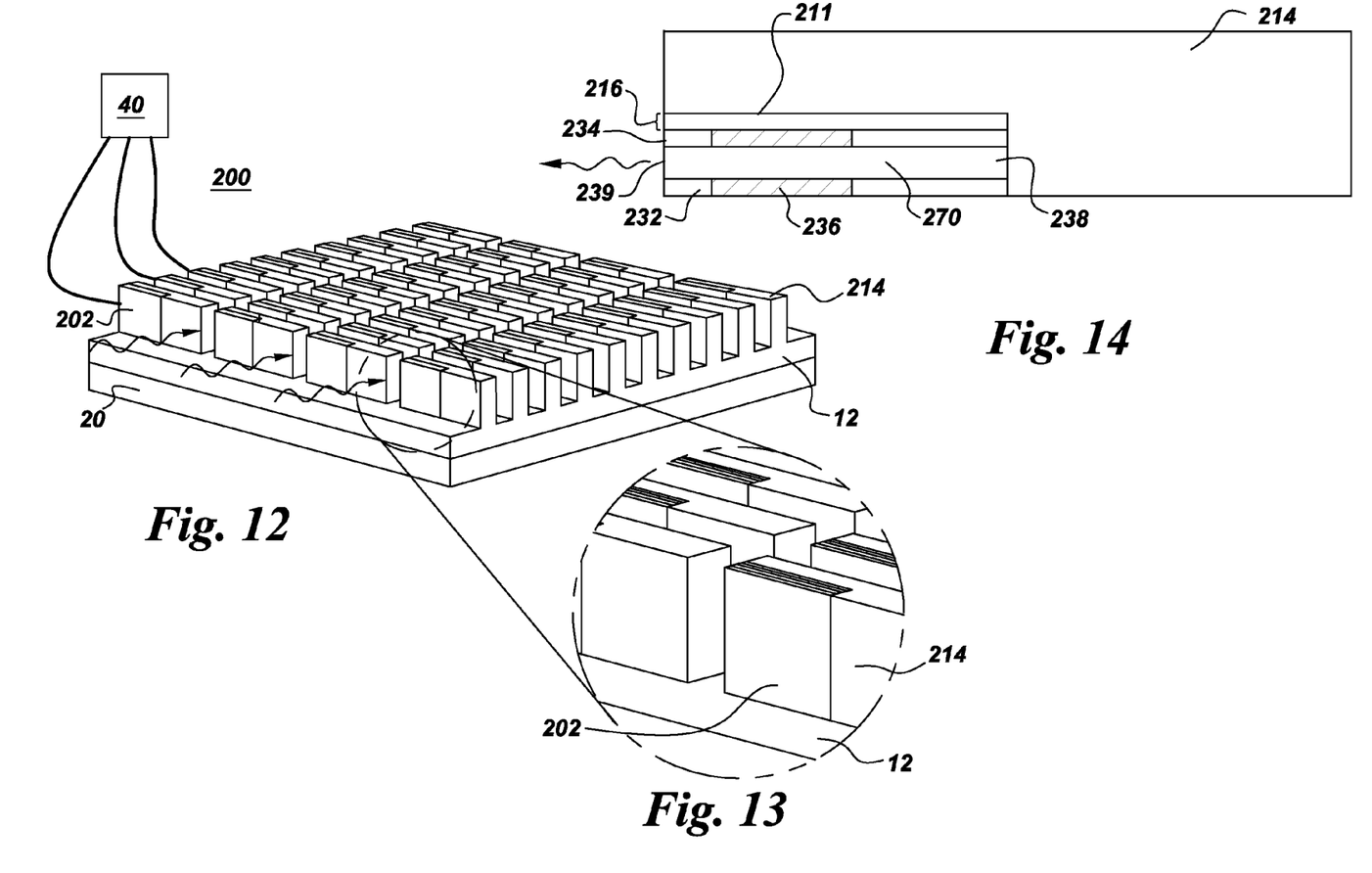
FIG. 12 illustrates another heat sink embodiment of the invention with distributed and integrated jet cooling.
FIG. 13 is an enlarged view of a portion of the heat sink of FIG. 12 showing several synthetic jets.
FIG. 14 schematically depicts, in cross-sectional view, an example configuration of a synthetic jet for use in the heat sink shown in FIGS. 12 and 13.

FIGS. 12-14 illustrate another heat sink 200 embodiment of the invention with distributed and integrated jet cooling. As shown for example in FIG. 12, the heat sink 200 includes a base 12 for thermal connection to at least one heated object 20. As discussed above, the heated object 20 may be any object requiring cooling. The heat sink 200 further includes an array of fins 214 thermally coupled to the base 12. At least a subset of the fins comprise synthetic jets 202 configured to eject an ambient fluid into an ambient environment of the fins 214 and base 12. For the example configuration shown in FIGS. 12 and 13, each of the fins 214 is coupled to a synthetic jet 202. However, for other arrangements (not shown) synthetic jets 202 are provided for only a subset of the fins 214.

FIG. 14 schematically depicts, in cross-sectional view, an example configuration of a synthetic jet 202 for use in the heat sink shown in FIGS. 12 and 13. For the example configuration shown in FIG. 14, the synthetic jet 202 comprises at least one flexible structure 232, a second structure 234, and at least one active material 236 coupled to the flexible structure 232. A compliant wall 238 is positioned between the flexible structure 232 and the second structure 234, thereby defining a chamber. The compliant wall defines at least one orifice, which is indicated by reference numeral 239, for facilitating fluid communication between the chamber and the ambient environment. Example active materials and example materials for the compliant wall are discussed above. Example materials for flexible structures 232, 234 include, but are not limited to metals, conductive polymers, and plastics.

For the example arrangement shown in FIG. 14, the second structure 234 comprises a second flexible structure 234, and the active material 236 is coupled to at least one of the first and second flexible structures. For the particular configuration shown in FIG. 14, the active material 236 is coupled to both flexible structures 232, 234, such that both structures can be actuated, for example upon application of an electric current. Further, for the arrangement shown in FIG. 14, the second flexible structure 234 is separated from the surface 211 of the fin 214 by a gap 216 when the synthetic jet 202 is in an unactuated state.

The operation of synthetic jet 202 is similar to that of synthetic jet 30, as discussed above with reference to FIGS. 5 and 6. Typically, a synthetic jet driver 40 is provided to apply an electrical current to the at least one active material 236, to form streams of ambient air. The synthetic jet driver 40 can be electrically coupled to the active material 236 using wires or flexible interconnects, for example. Briefly, upon application of an electrical current from synthetic jet driver 40, the active material 236 creates stress on the flexible wall 232 causing it to flex inwardly, resulting in a chamber volume change and an influx of ambient air into the chamber 270, and then outwardly, thereby ejecting the ambient air from the chamber 270 via the orifice 239. Similarly, when the active material 236 creates stress on the flexible chamber walls 232 it to expand, resulting in another chamber volume change, ambient air is drawn into the chamber 270 via the orifice 239. In this manner, the driver 40 actuates the jet 202. As note above, the synthetic jet driver 40 may be co-located with the other heat sink elements or may be remotely located. The current may be provided as a sine wave, a square wave, a triangular wave, or any other suitable waveform, and it should be appreciated that the current is not to be limited to any specific waveform.

Further, the synthetic jets 202 can be used alone or in combination with one or more fans 50, depending on the application. As discussed above with reference to FIG. 7, a fan 50 may be provided on one of an inlet and an outlet side 221, 223 of the array of fins 214, where the fan is configured to draw the ambient fluid through the fins, and where the ambient fluid drawn by the fan interacts with the ambient air ejected from the synthetic jets to further enhance the cooling. Similarly, and as discussed above with reference to FIG. 8, a fan 50 may be provided above the array of fins 214 and configured to blow the ambient fluid on the fins.

Although the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A heat sink with distributed jet cooling, the heat sink comprising:
    a base for thermal connection to at least one heated object;
    an array of fins thermally coupled to the base, wherein the fins are arranged in a staggered configuration to provide a v-groove cooling configuration;
    at least one multi-orifice synthetic jet or multiple single orifice jets disposed on a side of the array of fins, wherein at least a subset of the orifices are positioned to eject an ambient fluid directly on the fins, and wherein the ambient fluid is ejected perpendicular to a plane of the fins; and
    a fan disposed on an inlet side of the array of fins, wherein the fan is configured to draw the ambient fluid through the fins, and wherein the ambient fluid drawn by the fan interacts with the ambient fluid ejected from the multi-orifice synthetic jets or multiple single orifice jets to further enhance the cooling at least ten percent (10%) relative to a jet-free condition.

2. The heat sink of claim 1, wherein each of the multi-orifice synthetic jets comprises:
    a first flexible structure;
    a second flexible structure;
    at least one active material coupled to at least one of the first and second flexible structures; and
    a compliant wall positioned between the first and second flexible structures and defining a chamber, wherein the compliant wall defines a plurality of orifices for facilitating fluid communication between the chamber and an ambient environment of the fins.

3. The heat sink of claim 1, comprising a plurality of the multi-orifice synthetic jets or multiple single orifice jets disposed on respective ones of the sides of the array of fins.

4. The heat sink of claim 1, wherein the fins comprise pin fins.

5. The heat sink of claim 1, wherein at least a subset of the orifices are oriented at an angle transverse to an opposing surface of the fins.

6. The heat sink of claim 1, further comprising a fan disposed on an outlet side of the array of fins, wherein the fan is configured to draw the ambient fluid through the fins, and wherein the ambient fluid drawn by the fan interacts with the ambient fluid ejected from the multi-orifice synthetic jets or multiple single orifice jets to further enhance the cooling at least ten percent (10%) relative to a jet-free condition.

7. The heat sink of claim 1, wherein the at least one active material is positioned on both of the first and second flexible structures.

8. The heat sink of claim 1, further comprising a fan disposed above the array of fins and configured to blow an ambient fluid on the fins.

9. The heat sink of claim 1, comprising a stack of the multi-orifice synthetic jets, wherein the stack is disposed on the respective side of the array of fins.

10. The heat sink of claim 1, wherein the fins comprises plate fins.

* * * * *